(12) United States Patent
Sasagawa et al.

(10) Patent No.: US 9,640,642 B2
(45) Date of Patent: May 2, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shinya Sasagawa, Chigasaki (JP); Hitoshi Nakayama, Atsugi (JP); Masashi Tsubuku, Atsugi (JP); Daigo Shimada, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/190,677

(22) Filed: Jun. 23, 2016

(65) Prior Publication Data

US 2016/0300933 A1    Oct. 13, 2016

Related U.S. Application Data

(60) Continuation of application No. 14/334,012, filed on Jul. 17, 2014, now Pat. No. 9,379,136, which is a
(Continued)

(30) Foreign Application Priority Data

Jul. 16, 2010   (JP) .................................. 2010-161374

(51) Int. Cl.
*H01L 21/00*   (2006.01)
*H01L 27/12*   (2006.01)
(Continued)

(52) U.S. Cl.
CPC ...... *H01L 29/66969* (2013.01); *H01L 27/088* (2013.01); *H01L 27/1214* (2013.01);
(Continued)

(58) Field of Classification Search
None
See application file for complete search history.

(56) References Cited

U.S. PATENT DOCUMENTS 5,404,581 A   4/1995   Honjo
5,731,856 A   3/1998   Kim et al.
(Continued)

FOREIGN PATENT DOCUMENTS

EP    1737044 A   12/2006
EP    2159844 A    3/2010
(Continued)

OTHER PUBLICATIONS

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Angel Roman
(74) *Attorney, Agent, or Firm* — Robinson Intellectual Propery Law Office; Eric J. Robinson

(57) ABSTRACT

When a transistor having bottom gate bottom contact structure is manufactured, for example, a conductive layer constituting a source and a drain has a three-layer structure and two-step etching is performed. In the first etching process, an etching method in which the etching rates for at least the second film and the third film are high is employed, and the first etching process is performed until at least the first film is exposed. In the second etching process, an etching method in which the etching rate for the first film is higher than that in the first etching process and the etching rate for a "layer provided below and in contact with the first film" is lower than that in the first etching process is employed. The side
(Continued)

wall of the second film is slightly etched when a resist mask is removed after the second etching process.

15 Claims, 7 Drawing Sheets

Related U.S. Application Data division of application No. 13/174,960, filed on Jul. 1, 2011, now Pat. No. 8,785,241.

(51) Int. Cl.
  H01L 29/66    (2006.01)
  H01L 29/49    (2006.01)
  H01L 29/45    (2006.01)
  H01L 29/786   (2006.01)
  H01L 27/088   (2006.01)

(52) U.S. Cl.
  CPC ...... *H01L 27/1225* (2013.01); *H01L 27/1288* (2013.01); *H01L 29/45* (2013.01); *H01L 29/4908* (2013.01); *H01L 29/7869* (2013.01)

(56) References Cited

U.S. PATENT DOCUMENTS

| | | | |
|---|---|---|---|
| 5,744,864 A | 4/1998 | Cillessen et al. | |
| 5,976,953 A | 11/1999 | Zavracky et al. | |
| 6,218,221 B1 * | 4/2001 | Sah ................... | H01L 27/1214 257/59 |
| 6,255,706 B1 | 7/2001 | Watanabe et al. | |
| 6,294,274 B1 | 9/2001 | Kawazoe et al. | |
| 6,376,861 B1 | 4/2002 | Yaegashi et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,371,621 B2 | 5/2008 | Kim et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,888,675 B2 | 2/2011 | Kim et al. | |
| 8,067,775 B2 | 11/2011 | Miyairi et al. | |
| 8,129,718 B2 | 3/2012 | Hayashi et al. | |
| 8,173,493 B2 | 5/2012 | Kim et al. | |
| 8,329,506 B2 | 12/2012 | Akimoto et al. | |
| 8,426,243 B2 | 4/2013 | Hayashi et al. | |
| 8,643,011 B2 | 2/2014 | Akimoto et al. | |
| 9,029,851 B2 | 5/2015 | Miyairi et al. | |
| 9,082,857 B2 | 7/2015 | Yamazaki et al. | |
| 9,318,512 B2 | 4/2016 | Miyairi et al. | |
| 9,397,194 B2 | 7/2016 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0203627 A1 * | 10/2003 | Pang ................. | H01L 21/32134 438/689 |
| 2003/0218222 A1 | 11/2003 | Wager, III et al. | |
| 2004/0038446 A1 | 2/2004 | Takeda et al. | |
| 2004/0087125 A1 | 5/2004 | Monoe | |
| 2004/0127038 A1 | 7/2004 | Carcia et al. | |
| 2004/0238827 A1 | 12/2004 | Takayama et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0202269 A1 | 9/2006 | Suzuki et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0042180 A1 | 2/2008 | Yamazaki et al. | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2009/0008639 A1 | 1/2009 | Akimoto et al. | |
| 2009/0061573 A1 | 3/2009 | Miyairi et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134390 A1 | 5/2009 | Kodama et al. | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0322214 A1 | 12/2009 | Lee et al. | |
| 2010/0006856 A1 | 1/2010 | Leonardi et al. | |
| 2010/0044717 A1 | 2/2010 | Choi et al. | |
| 2010/0062556 A1 | 3/2010 | Sasagawa et al. | |

(56) References Cited

U.S. PATENT DOCUMENTS

| | | | |
|---|---|---|---|
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0117091 | A1* | 5/2010 | Kaitoh ............. H01L 29/78618 257/72 |
| 2011/0049508 | A1* | 3/2011 | Kawamura ......... H01L 29/7869 257/43 |
| 2011/0180802 | A1* | 7/2011 | Morosawa .......... H01L 29/7869 257/59 |
| 2011/0207269 | A1 | 8/2011 | Sasagawa et al. |
| 2012/0003797 | A1 | 1/2012 | Sasagawa et al. |
| 2013/0207106 | A1 | 8/2013 | Hayashi et al. |
| 2014/0110709 | A1 | 4/2014 | Akimoto et al. |
| 2016/0197166 | A1 | 7/2016 | Miyairi et al. |
| 2016/0268437 | A1 | 9/2016 | Yamazaki et al. |

FOREIGN PATENT DOCUMENTS

| | | |
|---|---|---|
| EP | 2159845 A | 3/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-062628 A | 3/1996 |
| JP | 08-264794 A | 10/1996 |
| JP | 11-505377 | 5/1999 |
| JP | 2000-044236 A | 2/2000 |
| JP | 2000-101091 A | 4/2000 |
| JP | 2000-150900 A | 5/2000 |
| JP | 2000-208773 A | 7/2000 |
| JP | 2002-076356 A | 3/2002 |
| JP | 2002-198360 A | 7/2002 |
| JP | 2002-289859 A | 10/2002 |
| JP | 2002-341373 A | 11/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-027735 A | 2/2007 |
| JP | 2007-096055 A | 4/2007 |
| JP | 2007-123861 A | 5/2007 |
| JP | 2010-080936 A | 4/2010 |
| JP | 2010-080952 A | 4/2010 |
| JP | 2010-123938 A | 6/2010 |
| JP | 2010-153802 A | 7/2010 |
| WO | WO-2004/114391 | 12/2004 |
| WO | WO-2010/047217 | 4/2010 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZNO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS with a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZNO Thin-Film Transistors With Aluminum Oxide Dielectic Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Taiwanese Office Action (Application No. 100124218) Dated Feb. 24, 2016.

\* cited by examiner

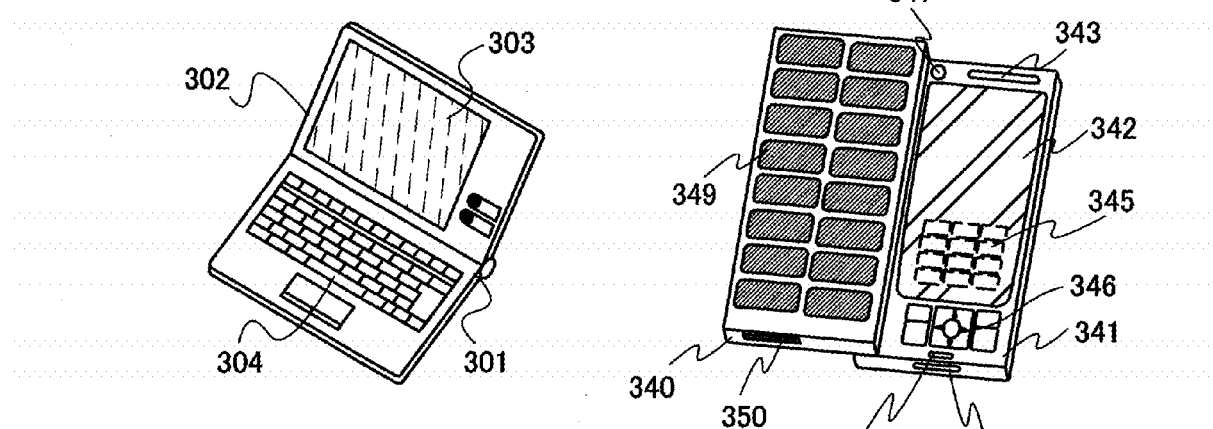

SEMICONDUCTOR DEVICE AND MANUFACTURING METHOD THEREOF

BACKGROUND OF THE INVENTION

1. Field of the Invention

The technical field of the present invention relates to a semiconductor device and a manufacturing method thereof. Note that in this specification, a semiconductor device refers to a semiconductor element itself or a device including a semiconductor element. As an example of such a semiconductor element, for example, a transistor (a thin film transistor and the like) can be given. In addition, a semiconductor device also refers to a display device such as a liquid crystal display device.

2. Description of the Related Art

In recent years, metal oxides having semiconductor characteristics (hereinafter, referred to as oxide semiconductors) have attracted attention. Oxide semiconductors may be applied to transistors (see Patent Documents 1 and 2), for example.

There are many types of transistors. For example, transistors may be classified as a bottom gate-type structure and a top gate-type structure according to the positional relationship among a substrate, a gate, and a channel formation region. A transistor structure having a gate placed between a channel formation region and a substrate is called a bottom gate-type structure. A transistor structure having a channel formation region placed between a gate and a substrate is called a top gate-type structure.

In addition, transistors may be classified as a bottom contact type and a top contact type according to connection portions of a source and a drain with a semiconductor layer in which a channel is formed. A transistor with a structure where the connection portions of a source and a drain with a semiconductor layer in which a channel is formed is placed on a substrate side is called a bottom contact type. A transistor with a structure where the connection portions of a source and a drain with a semiconductor layer in which a channel is formed is placed on a side opposite to a substrate (that is, a counter substrate side in a liquid crystal display device) is called a top contact type.

Types of transistors can be classified as a BGBC (bottom gate bottom contact) structure, a BGTC (bottom gate top contact) structure, a TGTC (top gate top contact) structure, and a TGBC (top gate bottom contact) structure.

REFERENCE

Patent Documents

[Patent Document 1] Japanese Published Patent Application No. 2007-123861
[Patent Document 2] Japanese Published Patent Application No. 2007-096055

SUMMARY OF THE INVENTION

An object of one embodiment of the present invention is to provide a transistor having a sufficiently large on-state current and a sufficiently small off-state current. Such a transistor having a sufficiently large on-state current and a sufficiently small off-state current has good switching characteristics.

Meanwhile, a transistor when applied to many types of products preferably has high reliability.

One of methods for examining reliability of transistors is a bias-temperature stress test (hereinafter, referred to as a Gate Bias Temperature (GBT) test). The GBT test is one kind of accelerated test and a change in characteristics, caused by long-term usage, of transistors can be evaluated in a short time. In particular, the amount of shift in threshold voltage of the transistor between before and after a GBT test is an important indicator for examining reliability. The smaller the shift in the threshold voltage between before and after a GBT test is, the higher the reliability of the transistor is.

In particular, the temperature of a substrate over which a transistor is formed is set at a fixed temperature. A source and a drain of the transistor are set at the same potential, and a gate is supplied with a potential different from those of the source and the drain for a certain period. The temperature of the substrate may be determined depending on the purpose of the test. Further, the potential applied to the gate is higher than the potential of the source and the drain (the potential of the source and the drain is the same) in a "+GBT test" while the potential applied to the gate is lower than the potential of the source and the drain (the potential of the source and the drain is the same) in a "−GBT test."

Strength of the GBT test may be determined based on the temperature of a substrate and electric field intensity and time period of application of the electric field to a gate insulating layer. The electric field intensity in the gate insulating layer is determined as the value of a potential difference between a gate, and a source and a drain divided by the value of the thickness of the gate insulating layer. For example, when an electric field intensity of the gate insulating layer having a thickness of 100 nm is 2 MV/cm, the potential difference is 20 V.

Furthermore, the shift in the threshold voltage of a transistor having an oxide semiconductor in a channel formation region is also confirmed by a GBT test.

Therefore, one embodiment of the present invention is to provide a semiconductor device having high reliability and threshold voltage which is difficult to shift despite long term usage.

Further, another embodiment of the present invention is to provide a semiconductor device having high reliability and good switching characteristics.

Furthermore, a gate, a source and a drain of a transistor are preferably formed over the same layer as a gate wiring and a source wiring. The gate wiring and the source wiring are preferably formed of a material having high conductivity.

The semiconductor device having good switching characteristics, which is one embodiment of the present invention, can be obtained by forming a semiconductor layer serving as a channel formation region to have a sufficient thickness to the thickness of the gate insulating layer.

Further, the semiconductor device having high reliability, which is one embodiment of the present invention, can be obtained by improving coverage of each layer to be provided.

Specific structures of one preferred embodiment of the present invention will be described below.

One embodiment of the present invention is an etching method including at least first and second etching processes. Here, a "film to be etched" preferably has a three-layer structure including a first film, a second film, and a third film from the lower side. In the first etching process, an etching method in which the etching rates for at least the second film and the third film are high is employed, and the first etching process is performed until at least the first film is exposed.

In the second etching process, an etching method in which the etching rate for the first film is higher than that in the first etching process and the etching rate for a "layer provided below and in contact with the first film" is lower than that in the first etching process is employed.

The above-described etching method that is one embodiment of the present invention can be applied to a manufacturing process of a semiconductor device. In particular, when the "film to be etched" is a conductive film, the etching method that is one embodiment of the present invention, described above is preferably used. Especially, the "layer provided below and in contact with the first film" is preferably a semiconductor layer. In other words, a transistor is preferably a top contact type.

In other words, one embodiment of the present invention is a method for manufacturing a semiconductor device, including the steps of forming a first wiring layer; forming an insulating layer to cover the first wiring layer; forming a semiconductor layer over the insulating layer; stacking a first conductive film, a second conductive film, and a third conductive film in this order over the semiconductor layer; forming a resist mask over the third conductive film; and performing etching including at least two steps on the first to third conductive films using the resist mask to form separated second wiring layers having a three-layer structure. The two-step etching includes a first etching process, which is performed until at least the first conductive film is exposed, and a second etching process, which is performed under the condition that the etching rate for the first conductive film is higher than that in the first etching process and the etching rate for the semiconductor layer is lower than that in the first etching process. After the second etching process, the resist mask is removed using a resist stripper.

Another embodiment of the present invention is a method for manufacturing a semiconductor device, including the steps of forming a semiconductor layer; stacking a first conductive film, a second conductive film, and a third conductive film in this order over the semiconductor layer; forming a resist mask over the third conductive film; performing etching including at least two steps on the first to third conductive films using the resist mask to form separated first wiring layers having a three-layer structure; forming an insulating layer to cover the first wiring layer and the semiconductor layer; and forming a second wiring layer to overlap with the semiconductor layer over the insulating layer. The two-step etching includes a first etching process, which is performed until at least the first conductive film is exposed, and a second etching process, which is performed under the condition that the etching rate for the first conductive film is higher than that in the first etching process and the etching rate for the semiconductor layer is lower than that in the first etching process. After the second etching process, the resist mask is removed using a resist stripper.

Note that the present invention is not limited thereto and a transistor may be a bottom contact type. In other words, in the BGBC or TGBC structure, the above-described etching method may be used for the formation of the source and the drain having a three-layer structure. In the BGBC structure, the "layer provided below and in contact with the first film" is a gate insulating layer. In the TGBC structure, the "layer provided below and in contact with the first film" is an insulating film or a substrate to be a base.

However, the present invention is not limited thereto, and the above-described etching method that is one embodiment of the present invention can be used when a conductive film to be a gate is etched.

In one embodiment of the present invention having any one of the above-described structures, the first etching process is performed using a gas containing more chlorine than fluorine as its main component and the second etching process is performed using a gas containing more fluorine than chlorine as its main component.

More specifically, a mixture gas of a $BCl_3$ gas and a $Cl_2$ gas are given as a gas containing more chlorine than fluorine as its main component. As a gas containing more fluorine than chlorine, a $SF_6$ gas is given.

In one embodiment of the present invention having any one of the above-described structures, it is preferable that the first conductive film be thicker than the third conductive film. This is because the layer provided below and in contact with the first conductive film is not easily exposed in the first etching process when the first conductive film is formed to be thick, and wiring resistance is reduced when the first conductive film is formed to be thick although the third conductive film is preferably thin because of being etched by the first etching.

In one embodiment of the present invention having any one of the above-described structures, when the second conductive film is formed to be thick, a conductive material for forming the second conductive film preferably has higher conductivity than a conductive material for forming the first conductive film and the third conductive film. This is because wiring resistance is reduced when the second conductive film is formed to be thick.

In one embodiment of the present invention having any one of the above-described structures, the first conductive film and the third conductive film may be titanium films and the second conductive film may be aluminum film, for example.

In one embodiment of the present invention having any one of the above-described structures, the semiconductor layer may be an oxide semiconductor layer, for example.

In one embodiment of the present invention having any one of the above-described structures, the oxide semiconductor layer may be formed of a material of IGZO, for example.

According to one embodiment of the present invention, the "layer provided below and in contact with the first film" can be prevented from being thinned. Thus, in the case where the "layer provided below and in contact with the first film" is a semiconductor layer, reduction in the thickness of the semiconductor layer can be prevented. Thus, the on-state current of the semiconductor layer can become sufficiently large and the off-state current of the semiconductor layer can become sufficiently small. Further, variation in the thickness of the semiconductor layer within a substrate surface, which occurs due to etching, can be prevented and variation in characteristics can be prevented.

According to one embodiment of the present invention, a semiconductor device having characteristics which hardly shift in a GBT test can be obtained.

BRIEF DESCRIPTION OF THE DRAWINGS

FIGS. 6A to 6F are electronic devices of Embodiment 3.

DETAILED DESCRIPTION OF THE INVENTION

Figure 1A:
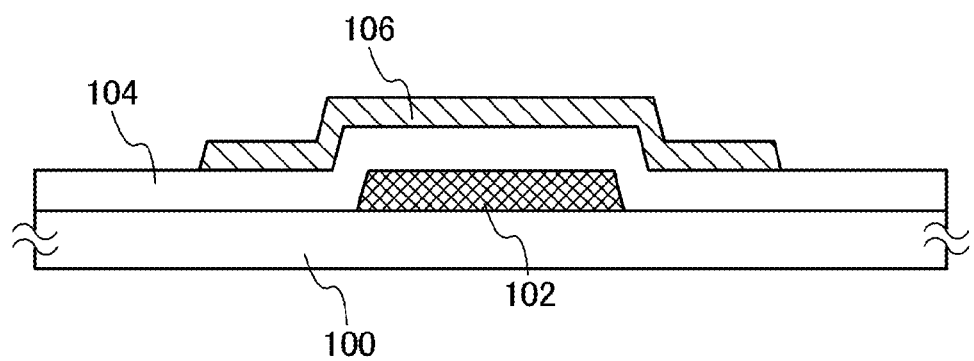
FIGS. 1A to 1C illustrate a method for manufacturing a semiconductor device of Embodiment 1.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. In addition, for convenience, an insulating layer is, in some cases, not illustrated in plan views.

Furthermore, hereinafter, ordinal numbers, such as "first" and "second," are used merely for convenience, and the present invention is not limited to the numbers.

Embodiment 1

In this embodiment, a semiconductor device that is one embodiment of the present invention and a manufacturing method thereof are described. A transistor is given as an example of a semiconductor device.

A method for manufacturing a transistor of this embodiment, which is described with reference to FIGS. 1A to 1C, FIGS. 2A to 2D, and FIGS. 3A to 3C includes the steps of forming a first wiring layer 102; forming a first insulating layer 104 to cover the first wiring layer 102; forming a semiconductor layer 106 over the first insulating layer 104; stacking a first conductive film 107A, a second conductive film 107B, and a third conductive film 107C in this order over the semiconductor layer 106 to form a multilayer conductive film 107; and performing etching including at least two steps on the multilayer conductive film 107 to form separated second wiring layers 108 having a three-layer structure. The two-step etching includes a first etching process, which is performed until at least the first conductive film 107A is exposed, and a second etching process, which is performed under the condition that the etching rate for the first conductive film 107A is higher than that in the first etching process and the etching rate for the semiconductor layer 106 is lower than that in the first etching process.

First, the first wiring layer 102 is formed over a substrate 100 at the selected areas, the first insulating layer 104 is formed to cover the first wiring layer 102, and the semiconductor layer 106 is formed over the first insulating layer 104 at the selected areas (FIG. 1A).

A substrate having an insulative surface may be used as the substrate 100. For example, a glass substrate, a quartz substrate, a semiconductor substrate having an insulating layer formed on its surface, or a stainless steel substrate having an insulating layer formed on its surface may be used as the substrate 100.

The first wiring layer 102 constitutes at least a gate of a transistor. The first wiring layer 102 may be formed of a conductive material. The first conductive layer 102 may be formed in such a manner that a conductive film is formed and is processed by photolithography.

The first insulating layer 104 constitutes at least a gate insulating layer of the transistor. The first insulating layer 104 may be formed of silicon oxide, silicon nitride, silicon oxynitride, silicon nitride oxide, or the like. When the semiconductor layer 106 is an oxide semiconductor layer, the first insulating layer 104 is preferably formed by a sputtering method so that moisture and hydrogen are removed as much as possible from the first insulating layer 104 which is in contact with the semiconductor layer 106. The first insulating layer 104 may be a single layer or a stack of a plurality of layers.

The first insulating layer 104 may be formed using gallium oxide, aluminum oxide, or other oxygen-excess oxides.

Note that "silicon oxynitride" contains more oxygen than nitrogen.

Further, "silicon nitride oxide" contains more nitrogen than oxygen.

Here, the semiconductor layer 106 is formed of oxide semiconductor. The semiconductor layer 106 may be formed in such a manner that a semiconductor film is formed and is processed by photolithography. For forming the semiconductor layer 106, an oxide semiconductor, which made to be an intrinsic (I-type) or a substantially intrinsic (I-type) by removing impurities to highly purify the oxide semiconductor so that impurities which are carrier donors besides main components do not exist in the oxide semiconductor as much as possible, is used.

The highly purified oxide semiconductor layer contains extremely few carriers (close to zero), and the carrier concentration thereof is lower than $1\times10^{14}/cm^3$, preferably lower than $1\times10^{12}/cm^3$, more preferably lower than $1\times10^{11}/cm^3$.

The off-state current can be small in a transistor because the number of carriers in the oxide semiconductor layer for forming the semiconductor layer 106 is extremely small. It is preferable that off-state current be as low as possible.

It is important that the state of the interface (interface state, interface charge, and the like) between the first insulating layer 104 and the semiconductor layer 106 be adjusted to be appropriate because such a highly purified oxide semiconductor is very sensitive to the interface state and interface charge. Thus, it is preferable that the first insulating layer 104 which is in contact with the highly purified oxide semiconductor have high quality. Here, the "first insulating layer 104 has high quality" means that there are few defects on the surface or inside the first insulating layer 104 and few defect levels and interface states to trap charge, and it is difficult to generate a fixed charge.

The first insulating layer 104 is preferably formed by, for example, a high-density plasma CVD method using a microwave (e.g., a frequency of 2.45 GHz) because the first insulating layer 104 can be a dense layer having high withstand voltage. This is because a close contact between the purified oxide semiconductor layer and a high-quality gate insulating layer reduces interface states and produces desirable interface characteristics Needless to say, another film formation method such as a sputtering method or a plasma CVD method can be employed as long as it enables formation of a high-quality insulating layer as the first insulating layer 104.

As an oxide semiconductor to be the semiconductor layer 106, the oxide semiconductor includes at least one element selected from In, Ga, Sn, Zn, Al, Mg, Hf, or lanthanoid like the following metal oxide can be used: a four-component metal oxide such as an In—Sn—Ga—Zn-based oxide semiconductor; a three-component metal oxide such as an In—Ga—Zn-based oxide semiconductor (also referred to as IGZO), an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor, an In—Hf—Zn-based oxide semiconductor, an In—La—Zn-based oxide semiconductor, an In—Ce—Zn-based oxide semiconductor, an In—Pr—Zn-based oxide semiconductor, an In—Nd—Zn-based oxide semiconductor, an In—Pm—Zn-based oxide semiconductor, an In—Sm—Zn-based oxide semiconductor, an In—Eu—Zn-based oxide semiconductor, an In—Gd—Zn-based oxide semiconductor, an In—Tb—Zn-based oxide semiconductor, an In—Dy—Zn-based oxide semiconductor, an In—Ho—Zn-based oxide semiconductor, an In—Er—Zn-based oxide semiconductor, an In—Tm—Zn-based oxide semiconductor, an In—Yb—Zn-based oxide semiconductor, an In—Lu—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, or an In—Mg-based oxide semiconductor; an one-component metal oxide such as an indium oxide, a tin oxide, or a zinc oxide; or the like. The above oxide semiconductor may contain $SiO_2$. Here, for example, an In—Ga—Zn-based oxide semiconductor means an oxide semiconductor containing In, Ga, or Zn, and there is no particular limitation on the composition ratio thereof. Further, In—Ga—Zn-based oxide semiconductor may contain an element other than In, Ga, or Zn.

An oxide semiconductor to be the semiconductor layer 106 may be represented by the chemical formula, $InMO_3(ZnO)_m$ (m>0). Here, M represents one or more metal elements selected from Ga, Al, Mn, and Co. For example, M can be Ga, Ga and Al, Ga and Mn, or Ga and Co. The above oxide semiconductor may contain $SiO_2$.

A target containing $In_2O_3$, $Ga_2O_3$, and ZnO at a composition ratio of 1:1:1 [molar ratio] may be used for forming the oxide semiconductor film to be the semiconductor layer 106 by a sputtering method. Without limitation on the material and the composition of the target, for example, a target containing $In_2O_3$, $Ga_2O_3$, and ZnO at a composition ratio of 1:1:2 [molar ratio] may be used. Here, for example, an In—Ga—Zn-based oxide semiconductor film means an oxide film containing indium (In), gallium (Ga), and zinc (Zn), and there is no particular limitation on the composition ratio.

The oxide semiconductor film for forming the semiconductor layer 106 is formed by a sputtering method with use of an In—Ga—Zn-based oxide semiconductor target. Further, the semiconductor layer 106 can be formed by a sputtering method under a rare gas (e.g., Ar) atmosphere, an oxygen atmosphere, or a mixed atmosphere containing a rare gas and an oxygen gas.

Further, the filling rate of the target is 90% to 100% inclusive, preferably 95% to 99.9% inclusive. With the use of the target having a high filling rate, the oxide semiconductor film to be formed can be a dense film.

Next, first heat treatment is performed on the semiconductor layer 106. The oxide semiconductor layer can be dehydrated or dehydrogenated by the first heat treatment. The temperature of the first heat treatment is higher than or equal to 400° C. and lower than or equal to 750° C., preferably higher than or equal to 400° C. and lower than the strain point of the substrate. In this embodiment, heat treatment may be performed in a nitrogen gas atmosphere at 450° C. for one hour as the first heat treatment. Note that there is no particular limitation on timing of the first heat treatment as long as it is after formation of the oxide semiconductor layer. Further, the atmosphere for performing the first heat treatment may be not only a nitrogen gas atmosphere, but also a mixed gas atmosphere containing an oxygen gas and a nitrogen gas, an oxygen gas atmosphere, and an atmosphere from which moisture is sufficiently removed (dry air). After the first heat treatment, the oxide semiconductor layer is preferably processed without exposure to the air so that water or hydrogen can be prevented from reentering the oxide semiconductor layer Dehydration or dehydrogenation may be performed on the first insulating layer 104 in advance by performing preheating before the semiconductor layer 106 is formed.

It is preferable that remaining moisture and hydrogen in a film-formation chamber be sufficiently removed before the semiconductor film to be the semiconductor layer 106 is formed. That is, before formation of the semiconductor film to be the semiconductor layer 106, evacuation is preferably performed with an entrapment vacuum pump (e.g., a cryopump, an ion pump, or a titanium sublimation pump).

Figure 1B:
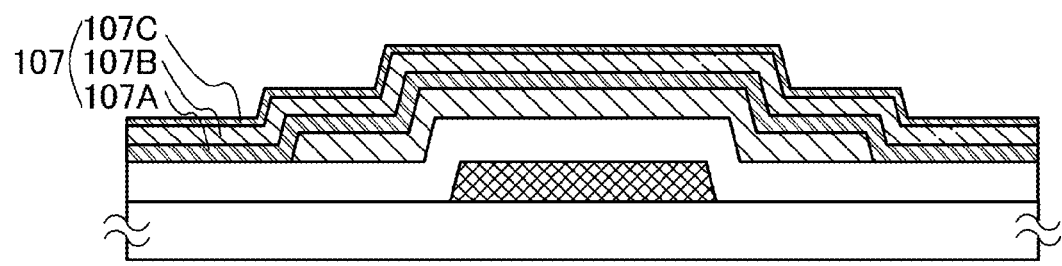

Next, the multilayer conductive film 107 is formed to cover the first insulating layer 104 and the semiconductor layer 106 (FIG. 1B).

The multilayer conductive film 107 includes the first conductive film 107A, the second conductive film 107B, and the third conductive film 107C in this order from the substrate 100 side. The first conductive film 107A, the second conductive film 107B, and the third conductive film 107C may be each formed of a conductive material. As a conductive material for forming the first conductive film 107A and the second conductive film 107C, Ti, W, Mo or Ta, or a nitride thereof can be given, for example. As a conductive material for forming the second conductive film 107B, Al is given, for example.

Figure 1C:
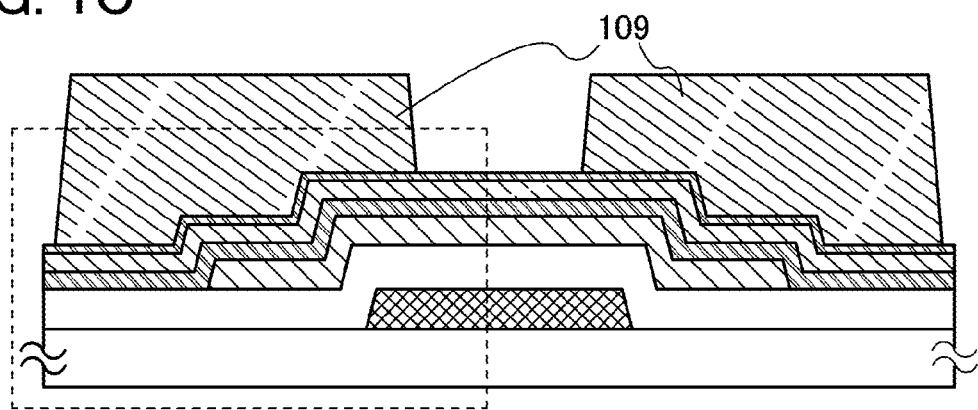

Next, a resist mask 109 is formed over the multilayer conductive film 107 at the selected areas (FIG. 1C). The resist mask 109 may be formed by photolithography.

Next, etching is performed on the multilayer conductive film 107 using the resist mask 109, whereby the second wiring layer 108 is formed. The second wiring layer 108 constitute at least source and drain of a transistor. The etching process for forming the second wiring layer 108 includes two-step etching. Here, the first and the second etching processes for forming the second wiring layer 108 are described with reference to FIGS. 2A to 2D, paying attention to a region in FIG. 1C surrounded by a dotted frame.

Figure 2A:
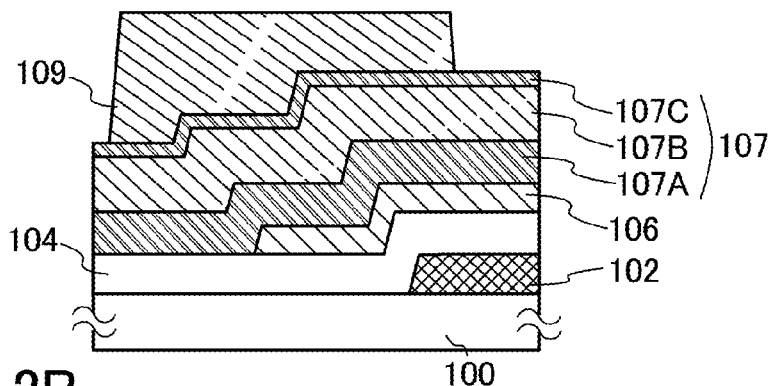
FIGS. 2A to 2D illustrate a method for manufacturing a semiconductor device of Embodiment 1.
Figure 2B:
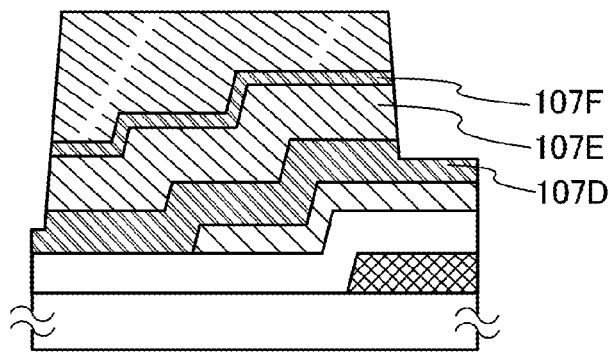

First, using the resist mask 109 (FIG. 2A), the multilayer conductive film 107 is etched until at least the first conductive film 107A is exposed (the first etching process). Here, the first conductive film 107A is etched, whereby a first conductive film 107D is formed. The first conductive film 107D exists over the entire surface of the first insulating layer 104 and the semiconductor layer 106, and there is no particular limitation on the etching depth of the first conductive film 107A as long as the insulating layer 104 and the semiconductor layer 106 are not exposed (FIG. 2B). Note that a portion of the second conductive film 107B, which does not overlap with the resist mask 109, is etched, whereby a second conductive film 107E is formed. Further, a portion of the third conductive film 107C, which does not overlap with the resist mask 109, is etched, whereby a third conductive film 107F is formed.

Note that the first etching process may be performed in a gas atmosphere containing a large amount of chlorine as its main component (a larger amount of chlorine than fluorine). Here, as an example of the gas containing a large amount of chlorine, a $CCl_4$ gas, a $SiCl_4$ gas, a $BCl_3$ gas, or a $Cl_2$ gas can be given. Specifically, a mixed gas of a $BCl_3$ gas and a $Cl_2$ gas is preferably used.

Figure 2C:
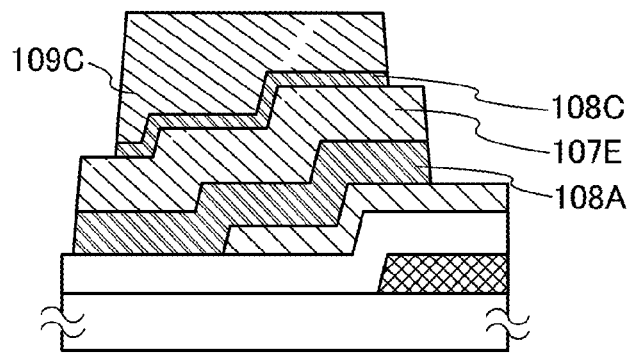

Then, the first conductive film 107D is etched until the first insulating layer 104 and the semiconductor layer 106 are exposed, whereby a first layer 108A of the second wiring layer is formed (the second etching process). Here, the third conductive film 107F is etched because of recession of the resist mask, whereby a third layer 108C of the second wiring layer is formed. Note that in the second etching process, it is only necessary that at least the first insulating layer 104 and the semiconductor layer 106 are exposed and the exposed semiconductor layer 106 is not removed by the etching (FIG. 2C).

Note that the second etching process may be performed in a gas atmosphere containing a large amount of fluorine as its main component (a larger amount of fluorine than chlorine). Here, as an example of the gas containing a large amount of fluorine, a $CF_4$ gas, a $SF_6$ gas, a $NF_3$ gas, a $CBrF_3$ gas, $CF_3SO_3H$ gas, or $C_3F_8$ can be given. Specifically, a $SF_6$ gas is preferably used.

As described above, it is known that the gas containing a large amount of fluorine as its main component (specifically, a $SF_6$ gas) has a high etching rate for a resist mask and reduce the size of the resist mask (the resist mask is made to recede). Thus, the resist mask 109 is reduced in size by the second etching, whereby a resist mask 109C is formed. Further, by the reduction in size of the resist mask 109, a portion of the third conductive film 107F, which does not overlap with the resist mask 109C, is also etched. However, in the case where the second conductive film 107E is formed of a material containing Al as its main component, for example, the second conductive film 107E is not etched.

However, the present invention is not limited thereto, and a portion of the second conductive film 107E, which does not overlap with the resist mask 109C may be etched.

Figure 2D:
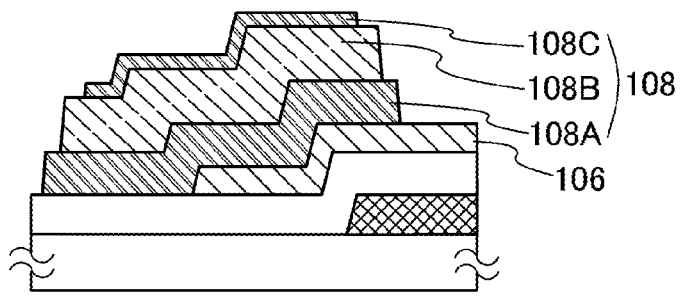

Lastly, the resist mask 109C is removed (FIG. 2D). In the case where the second conductive film 107E is formed of a material containing Al as its main component, a product containing aluminum is attached to a side wall of the second conductive film 107E due to the second etching. When the resist mask 109C is removed by a resist stripper in this state, the side wall of the second conductive film 107E is slightly etched and a second layer 108B of the second wiring layer is formed. Here, as the resist stripper, a chemical solution which corrodes aluminum may be used. "Nagase resist strip N-300" (manufactured by Nagase ChemteX Co., Ltd.) may be used, for example. Note that "Nagase resist strip N-300" (manufactured by Nagase ChemteX Co., Ltd.) includes 2-aminoethanol and glycol ether at 30 wt % and 70 wt %, respectively.

As described above, the multilayer conductive film 107 is etched to form the second wiring layers 108, so that the separated second wiring layers 108 can be formed while the thickness of the semiconductor layer 106 in a portion to be a channel formation region is kept. By forming the second wiring layer 108 using such an etching method, variation in thickness of the semiconductor layer 106 in the portion to be a channel formation region within the substrate surface can be small even when the substrate 100 has a large area.

Further, in the second wiring layer 108 formed as described above, the side walls of the first layer 108A, the second layer 108B, and the third layer 108C of the second wiring layer do not exist in the same plane. The second wiring layer 108 has a side wall with a three-stepped shape.

Figure 3A:
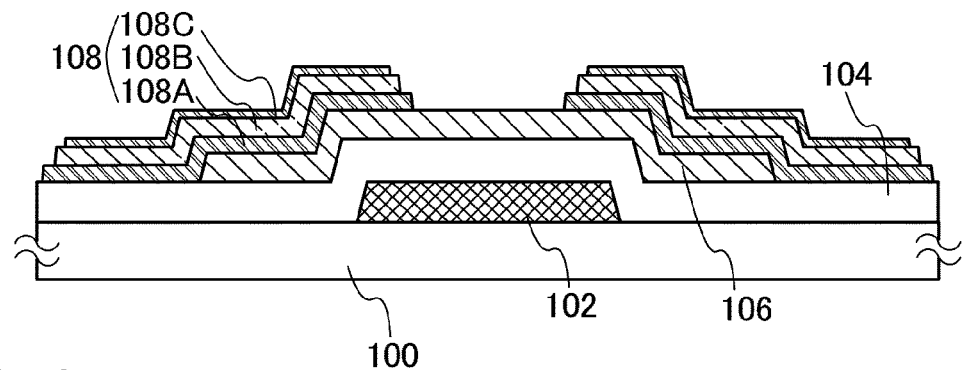
FIGS. 3A to 3C illustrate a method for manufacturing a semiconductor device of Embodiment 1.

As explained above, the transistor according to this embodiment is achieved (FIG. 3A).

Note that the transistor shown in FIG. 3A is provided over the substrate 100 and includes the first wiring layer 102, the first insulating layer 104 formed to cover the first wiring layer 102, the semiconductor layer 106 formed over the first insulating layer 104, and the second wiring layer 108 formed to overlap the semiconductor layer 106. There is little difference between the thickness (referred to as "first thickness") of a portion of the semiconductor layer 106, which does not overlap with the second wiring layer 108 and the thickness (referred to as, "the second thickness") of a portion of the semiconductor layer 106, which overlaps with the second wiring layer 108.

Further, in the transistor shown in FIG. 3A, the on-state current of the transistor can be sufficiently large and the off-state current of the transistor can be sufficiently small because the thickness of the semiconductor layer 106 can be kept thick. Further, it is possible to achieve transistors in which variation in characteristics is small because there is little variation in thickness of semiconductor layers within the substrate surface due to etching even when the transistor 100 has a large area The thickness of the semiconductor layer 106 may depend on the relationship with the thickness of the first insulating layer 104. When the thickness of the first insulating layer 104 is 100 nm, the thickness of the semiconductor layer 106 may be approximately greater than or equal to 15 nm. The reliability of the transistor may be improved when the thickness of the semiconductor layer 106 is greater than or equal to 25 nm. The thickness of the semiconductor layer 106 is preferably 30 nm to 40 nm.

Figure 3B:
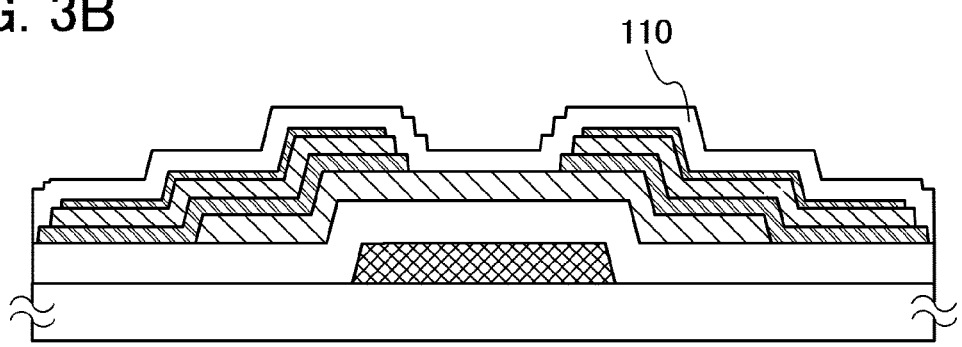

Meanwhile, a second insulating layer 110 is formed further in the transistor shown in FIG. 3A (FIG. 3B).

The second insulating layer 110 may be formed of silicon oxide, silicon nitride, silicon oxynitride or the like, and is preferably formed by a sputtering method. It is because water or hydrogen can be prevented from reentering the semiconductor layer 106. Specifically, a portion of the second insulating layer 110, which is in contact with the semiconductor layer 106, is preferably formed of silicon oxide. Otherwise, when the second insulating layer 110 has a structure having a plurality of stacked layers, at least a layer, which is in contact with the semiconductor layer 106, may be formed of silicon oxide, and an organic resin layer or the like may be formed over the silicon oxide layer.

Next, second heat treatment (preferably at greater than or equal to 200° C. and less than or equal to 400° C., for example, greater than or equal 250° C. and less than or equal to 350° C.) is performed in an inert gas atmosphere, or an oxygen gas atmosphere. For example, the second heat treatment is performed in a nitrogen gas atmosphere at 250° C. for one hour. In the second heat treatment, heat is applied while part of the oxide semiconductor layer (a channel formation region) is in contact with the second insulating layer 110. Further, the second heat treatment may be performed after forming the second insulating layer 110. However, the timing is not limited thereto.

Figure 3C:
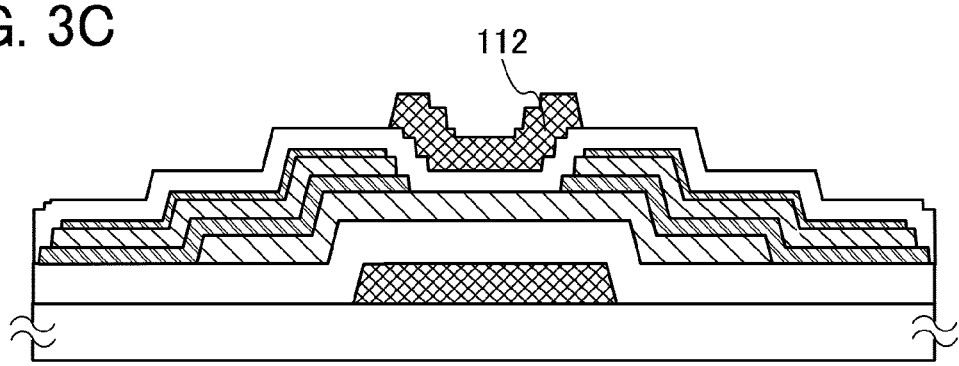

Further, the third wiring layer 112 is formed over the second insulating layer 110 at the selected area to overlap with the channel formation region of the semiconductor layer 106 (FIG. 3C). Because the third wiring layer 112 functions as a back gate, it may be formed of conductive material. The third wiring layer 112 may be an electrically independent wiring, electrically connected to the first wiring layer 102, or floating. The third wiring layer 112 can be formed using a material and a method which are similar to those of the first wiring layer 102

When the third wiring layer 112 is an electrically independent wiring, it may function as a back gate which does not depend on the potential of the first wiring layer 102. In this case, it is possible to control the threshold voltage by the back gate.

When the third wiring layer 112 is electrically connected to the first wiring layer 102, the potential of the third wiring layer 112 can be equal to the potential of the first wiring layer 102 or the potential in accordance with the potential of the first wiring layer 102. When the third wiring layer 112 is set to the potential in accordance with the potential of the first wiring layer 102, a resistor may be provided between a gate formed using the first wiring layer 102 and a back gate formed using the third wiring layer 112. At this time, the current per unit area when the transistor is on can be increased.

When the third wiring layer 112 is floating, the third wiring layer 112 cannot function as a back gate, but it is possible to function as an additional protection layer for the semiconductor layer 106.

Further, a transistor having the semiconductor layer 106, which is a highly purified oxide semiconductor layer, can decrease the current in an off state (off-state current) to a level under 10 zA/μm (less than 10 zA per 1 μm of the channel width), under 100 zA/μm at 85° C. That is, the off-state current can be lowered to be around the measurement limit or below the measurement limit.

Embodiment 2

The present invention is not limited to the mode described in Embodiment 1. For example, a transistor may have a TGTC structure as a semiconductor device of one embodiment of the present invention.

A method for manufacturing a transistor according to one embodiment of the present invention, described with reference to FIGS. 4A to 4C, and FIGS. 5A to 5D includes the steps of forming a semiconductor layer 206; stacking a first conductive film 207A, a second conductive film 207B, and a third conductive film 207C in this order over the semiconductor layer 206 to form a multilayer conductive film 207; performing etching including at least two steps on the multilayer conductive film 207 to form the separated first wiring layers 208 having a three-layer structure; forming an insulating layer 210 to cover the first wiring layer 208 and the semiconductor layer 206; and forming a second wiring layer 212 over the semiconductor layer 210 to overlap with the semiconductor layer 206. The two-step etching includes the first etching process, which is performed until at least the first conductive film 207A is exposed, and the second etching process, which is performed under the condition that the etching rate for the first conductive film 207A is higher than that in the first etching process and the etching rate for the semiconductor layer 206 is lower than that in the first etching process.

Figure 4A:
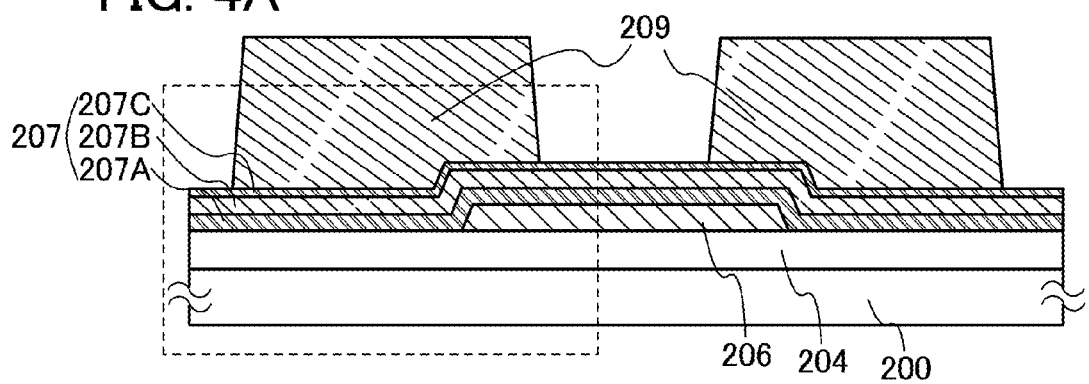
FIGS. 4A to 4C illustrate a method for manufacturing a semiconductor device of Embodiment 2.

First, a base insulating layer 204 is preferably formed over the substrate 200, and the semiconductor layer 206 is formed over the substrate 200 or the base insulating layer 204 at the selected area (FIG. 4A).

The substrate 200 may be the same as the substrate 100 of Embodiment 1.

The base insulating layer 204 can be formed of the same material and by the same method as the first insulating layer 104 of Embodiment 1.

The semiconductor layer 206 can be formed of the same material and by the same method as the semiconductor layer 106 of Embodiment 1.

Next, the multilayer conductive film 207 is formed over the base insulating layer 204 and the semiconductor layer 206, and a resist mask 209 is formed over the multilayer conductive film 207 at the selected area (FIG. 4A).

The multilayer conductive film 207 can be formed of the same material and by the same method as the multilayer conductive film 107 of Embodiment 1.

The resist mask 209 can be formed by photolithography as the resist mask 109 of Embodiment 1.

Next, etching is performed on the multilayer conductive film 207 using the resist mask 209, whereby the first wiring layer 208 is formed. The first wiring layer 208 constitutes at least source and drain of a transistor. The etching process for forming the first wiring layer 208 includes two-step etching. Here, the first and the second etching processes for forming the first wiring layer 208 are described with reference to FIGS. 5A to 5D, paying attention to a region in FIG. 4A surrounded by a dotted frame.

Figure 5A:
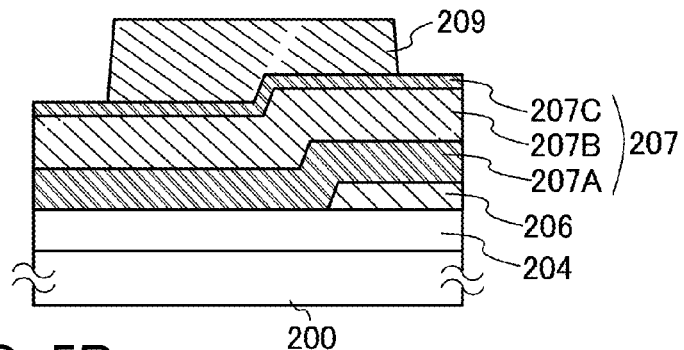
FIGS. 5A to 5D illustrate a method for manufacturing a semiconductor device of Embodiment 2.
Figure 5B:
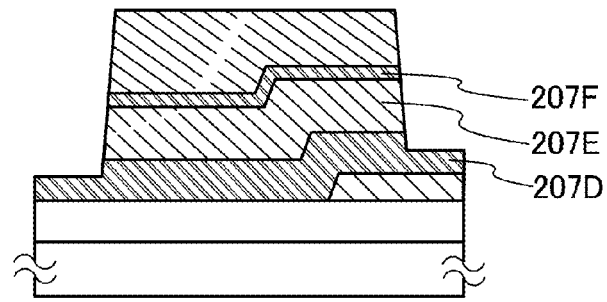

First, using the resist mask 209 (FIG. 5A), the multilayer conductive film 207 is etched until at least the first conductive film 207A is exposed (the first etching process). Here, the first conductive film 207A is etched, whereby a first conductive film 207D is formed. The first conductive film 207D exists over the entire surface of the base insulating layer 204 and the semiconductor layer 206, and there is no particular limitation on the etching depth of the first conductive film 207A as long as the base insulating layer 204 and the semiconductor layer 206 are not exposed (FIG. 5B). Note that a portion of the second conductive film 207B, which does not overlaps with the resist mask 209, is etched, whereby a second conductive film 207E is formed. Further, a portion of the third conductive film 207C, which does not overlap with the resist mask 209, is etched, whereby a third conductive film 207F is formed.

Note that the first etching process may be performed in a gas atmosphere containing a large amount of chlorine as its main component (a larger amount of chlorine than fluorine). Here, as an example of the gas containing a large amount of chlorine, a $CCl_4$ gas, a $SiCl_4$ gas, a $BCl_3$ gas, or a $Cl_2$ gas can be given. Specifically, a mixed gas of a $BCl_3$ gas and a $Cl_2$ gas is preferably used.

Figure 5C:
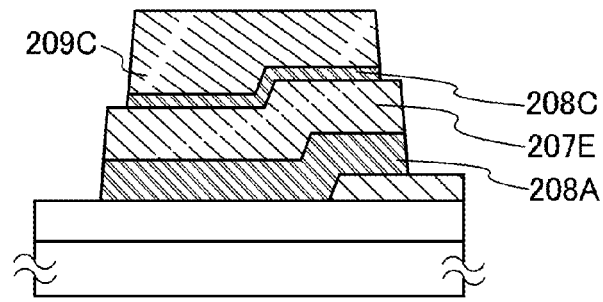

Next, the first conductive film 207D is etched until the base insulating layer 204 and the semiconductor layer 206 are exposed, whereby a first layer 208A of the first wiring layer is formed (the second etching process). Here, the third conductive film 207F is etched because of the recession of the resist mask, whereby a third layer 208C of the first wiring layer is formed. Note that in the second etching process, it is only necessary that at least the base insulating layer 204 and the semiconductor layer 206 are exposed and the exposed semiconductor layer 206 is not removed by the etching (FIG. 5C).

Note that the second etching process may be performed in a gas atmosphere containing a large amount of fluorine as its main component (a larger amount of fluorine than chlorine). Here, as an example of the gas containing a large amount of fluorine, a $CF_4$ gas, a $SF_6$ gas, a $NF_3$ gas, a $CBrF_3$ gas, $CF_3SO_3H$ gas, or $C_3F_8$ can be given. Specifically, a $SF_6$ gas is preferably used.

As described above, it is known that the gas containing a large amount of fluorine as its main component (specifically, a $SF_6$ gas) has a high etching rate for a resist mask and reduce the size of the resist mask (the resist mask is made to recede). Thus, the resist mask 209 is reduced in size by the second etching, whereby a resist mask 209C is formed. Further, by the reduction in size of the resist mask 209, a portion of the third conductive film 207F, which does not overlap with the resist mask 209C, is also etched. However, in the case where the second conductive film 207E is formed of a material containing Al as its main component, for example, the second conductive film 207E is not etched.

However, the present invention is not limited thereto, and a portion of the second conductive film 207E, which does not overlap with the resist mask 209C, may be etched.

Figure 5D:
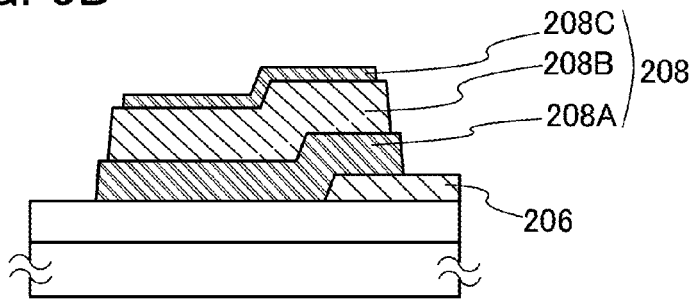

Lastly, the resist mask 209C is removed (FIG. 5D). In the case where the second conductive film 207E is formed of a material containing Al as its main component, a product containing aluminum is attached to a side wall of the second conductive film 207E due to the second etching. When the resist mask 209C is removed by a resist stripper in this state, the side wall of the second conductive film 207E is slightly etched and a second layer 208B of the first wiring layer is formed. Here, as the resist stripper, a chemical solution which corrodes aluminum may be used. "Nagase resist strip N-300" (manufactured by Nagase ChemteX Co., Ltd.) may be used, for example.

As described above, the multilayer conductive film 207 is etched to form the first wiring layers 208, so that the separated first wiring layers 208 can be formed while the thickness of the semiconductor layer 206 in a portion to be a channel formation region is kept. By forming the first wiring layer 208 using such an etching method, variation in thickness of the semiconductor layer 206 in the portion to be a channel formation region within the substrate surface can be small even when the substrate 200 has a large area.

Figure 4B:
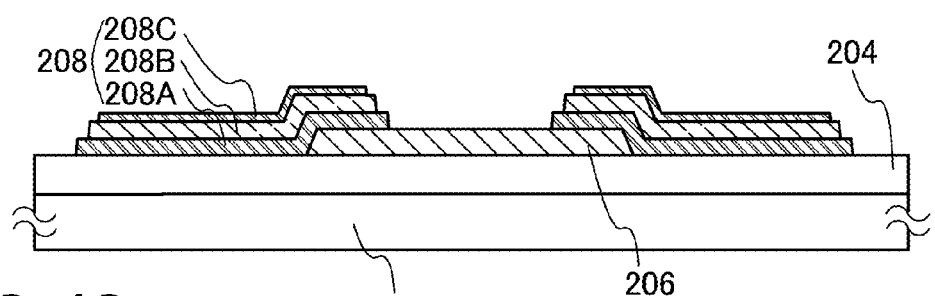

Further, in the second wiring layer 208 formed as described above, the side walls of the first layer 208A, the second layer 208B, and the third layer 208C of the first wiring layer do not exist in the same plane. The first wiring layer 208 has a side wall with a three-stepped shape (FIG. 4B).

Figure 4C:
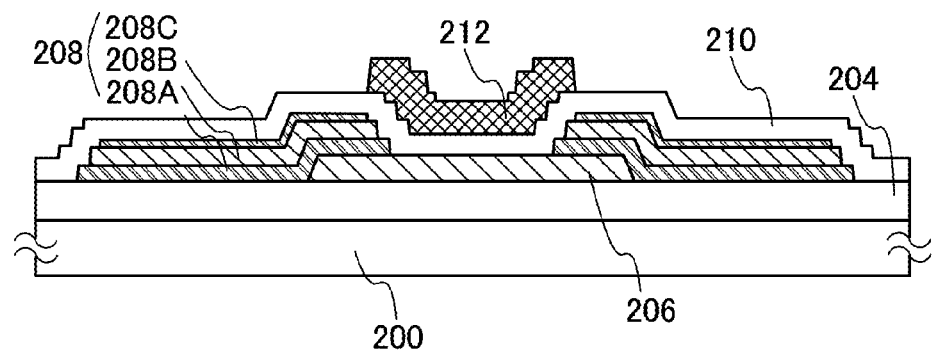

Then, the insulating layer 210 is formed over the first wiring layer 208, the semiconductor layer 206, and the base insulating layer 204 (FIG. 4C). The insulating layer 210 constitutes at least a gate insulating layer of the transistor.

The insulating layer 210 can be formed of the same material and by the same method as the first insulating layer 104 of Embodiment 1. Thus, the first insulating layer 210 may be formed using gallium oxide, aluminum oxide, or other oxygen-excess oxides.

Next, the second wiring layer 212 is formed over the insulating layer 210 at the selected area to overlap with at least the semiconductor layer 206 (FIG. 4C). The second wiring layer 212 constitutes at least a gate of the transistor. Accordingly, the transistor according to this embodiment is manufactured (FIG. 4C).

Further, the transistor shown in FIG. 4C includes the semiconductor layer 206, the separated first wiring layers 208, over the semiconductor layer 206, the insulating layer 210 formed to cover the first wiring layer 208, and the second wiring layer 212 provided over the insulating layer 210. There is little difference between the thickness (hereinafter, "first thickness") of a portion of the semiconductor layer 206, which does not overlap with the first wiring layer 208 and the thickness (hereinafter, "the second thickness") of a portion of the semiconductor layer 206, which overlaps with the first wiring layer 208.

Further, in the transistor shown in FIG. 4C, the on-state current of the transistor can be sufficiently large and the off-state current of the transistor can be sufficiently small because the thickness of the semiconductor layer 206 can be kept thick. Further, it is possible to achieve transistors in which variation in characteristics is small because there is little variation in thickness of semiconductor layers within the substrate surface due to etching even when the transistor 200 has a large area The thickness of the semiconductor layer 206 may depend on the relationship with the thickness of the insulating layer 210. When the thickness of the insulating layer 210 is 100 nm, the thickness of the semiconductor layer 206 may be approximately greater than or equal to 15 nm. The reliability of the transistor is improved when the thickness of the semiconductor layer 206 is greater than or equal to 25 nm. The thickness of the semiconductor layer 206 is preferably greater than or equal to 25 nm and less than or equal to 50 nm.

As explained in this embodiment, a transistor having a TGTC structure may be manufactured by adjusting the thickness of the semiconductor layer.

Further, although not illustrated, a back gate may be provided between the base insulating layer 204 and the substrate 200 to overlap with the semiconductor layer 206. Disposing the back gate in this manner may provide the same effect as forming the third wiring layer 112 in Embodiment 1.

Note that the oxide semiconductor layer is highly purified also in this embodiment. A transistor having the semiconductor layer 206, which is a highly purified oxide semiconductor layer, can decrease the current in an off state (off-state current) to a level under 10 zA/µm (less than 10 zA per 1 µm of the channel width), under 100 zA/µm at 85° C. That is, the off current can be lowered to be around the measurement limit or below the measurement limit.

However, the present invention is not limited to the modes described in Embodiments 1 and 2, and can be changed as appropriate within the range without depart from the spirit of the present invention. For example, the transistor may have a BGBC structure or a TGBC structure.

Embodiment 3

Next, electronic devices according to an embodiment of the present invention will be described. In the electronic devices of this embodiment, at least one of transistors described in Embodiments 1 and 2 is mounted. Examples of the electronic devices of the present invention include a computer, a mobile phone (also referred to as a cellular phone or a mobile phone device), a portable information terminal (including a portable game machine, an audio reproducing device, and the like), a digital camera, a digital video camera, electronic paper, and a television device (also referred to as a television or a television receiver). For example, the transistor described in either Embodiment 1 or 2 may be used as a pixel transistor constituting a pixel portion of such an electronic device.

FIG. 6A illustrates a laptop personal computer, which includes a housing 301, a housing 302, a display portion 303, a keyboard 304, and the like. The transistor described in either Embodiment 1 or 2 is provided in the housings 301 and 302. By mounting the transistor described in Embodiment 1 or 2 on the laptop personal computer illustrated in FIG. 6A, display unevenness of the display portion can be reduced and reliability can be improved.

FIG. 6B illustrates a portable information terminal (PDA), which includes a display portion 313, an external interface 315, an operation button 314, and the like in a main body 311. Further, a stylus 312 for operating the portable information terminal or the like is provided. The transistor described in either Embodiment 1 or 2 is provided in the main body 311. By mounting the transistor described in Embodiment 1 or 2 on the PDA illustrated in FIG. 6B, display unevenness of the display portion can be reduced and reliability can be improved.

FIG. 6C illustrates an e-book reader 320 mounted with electronic paper, which includes two housings of a housing 321 and a housing 323. The housing 321 and the housing 323 include a display portion 325 and a display portion 327, respectively. The housing 321 is combined with the housing 323 by a hinge 337, so that the e-book reader 320 can be opened and closed using the hinge 337 as an axis. The housing 321 is provided with a power switch 331, operation keys 333, a speaker 335, and the like. At least one of the housing 321 and the housing 323 is provided with the transistor described in either Embodiment 1 or 2. By mounting the transistor described in Embodiment 1 or 2 on the e-book reader illustrated in FIG. 6C, display unevenness of the display portion can be reduced and reliability can be improved.

FIG. 6D illustrates a mobile phone which includes two housings of a housing 340 and a housing 341. Moreover, the housings 340 and 341 which are shown unfolded in FIG. 6D can overlap with each other by sliding. Thus, the mobile phone can be in a suitable size for portable use. The housing 341 includes a display panel 342, a speaker 343, a microphone 344, a pointing device 346, a camera lens 347, an external connection terminal 348, and the like. The housing 340 is provided with a solar cell 349 for charging the mobile phone, an external memory slot 350, and the like. In addition, an antenna is incorporated in the housing 341. At least one of the housing 340 and the housing 341 is provided with the transistor described in either Embodiment 1 or Embodiment 2. By mounting the transistor described in Embodiment 1 or 2 on the mobile phone illustrated in FIG. 6D, display unevenness of the display portion can be reduced and reliability can be improved.

FIG. 6E illustrates a digital camera which includes a main body 361, a display portion 367, an eyepiece 363, an operation switch 364, a display portion 365, a battery 366, and the like. The transistor described in either Embodiment 1 or 2 is provided in the main body 361. By mounting the transistor described in Embodiment 1 or 2 on the digital camera illustrated in FIG. 6E, display unevenness of the display portion can be reduced and reliability can be improved.

FIG. 6F is a television set 370 which includes a housing 371, a display portion 373, a stand 375, and the like. The television set 370 can be operated by an operation switch included in the housing 371 or by a remote controller 380. In the housing 371 or the remote controller 380, the transistor described in either Embodiment 1 or 2 is mounted. By mounting the transistor described in Embodiment 1 or 2 on the television set illustrated in FIG. 6F, display unevenness of the display portion can be reduced and reliability can be improved.

Example 1

Figure 7A:
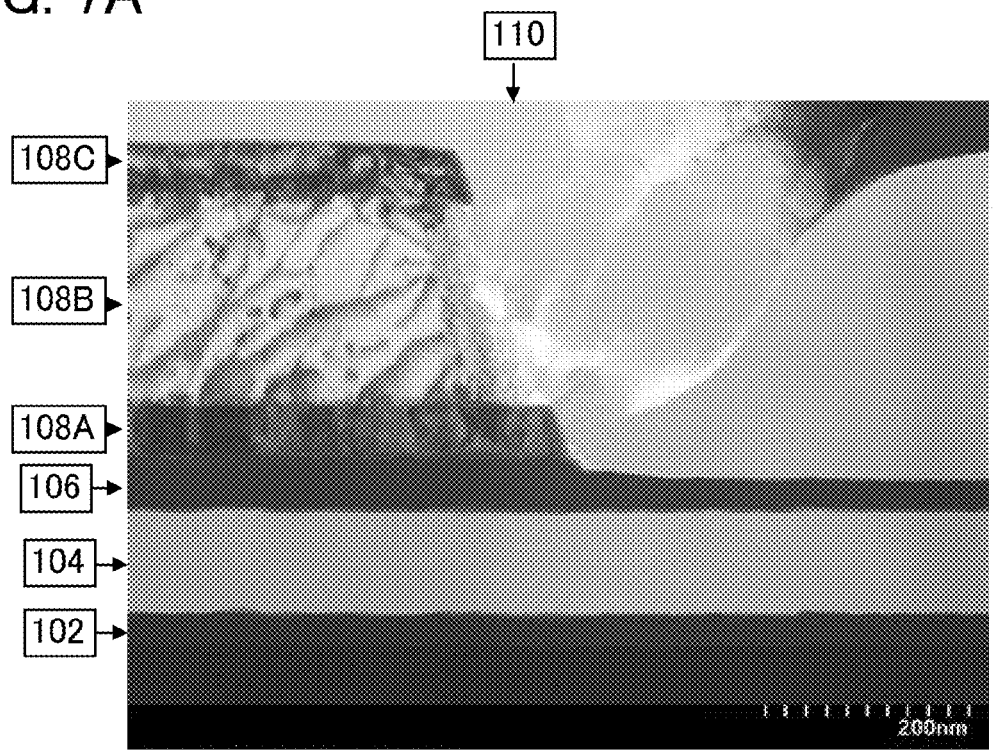
FIGS. 7A and 7B are STEM images described in Example 1.
Figure 7B:
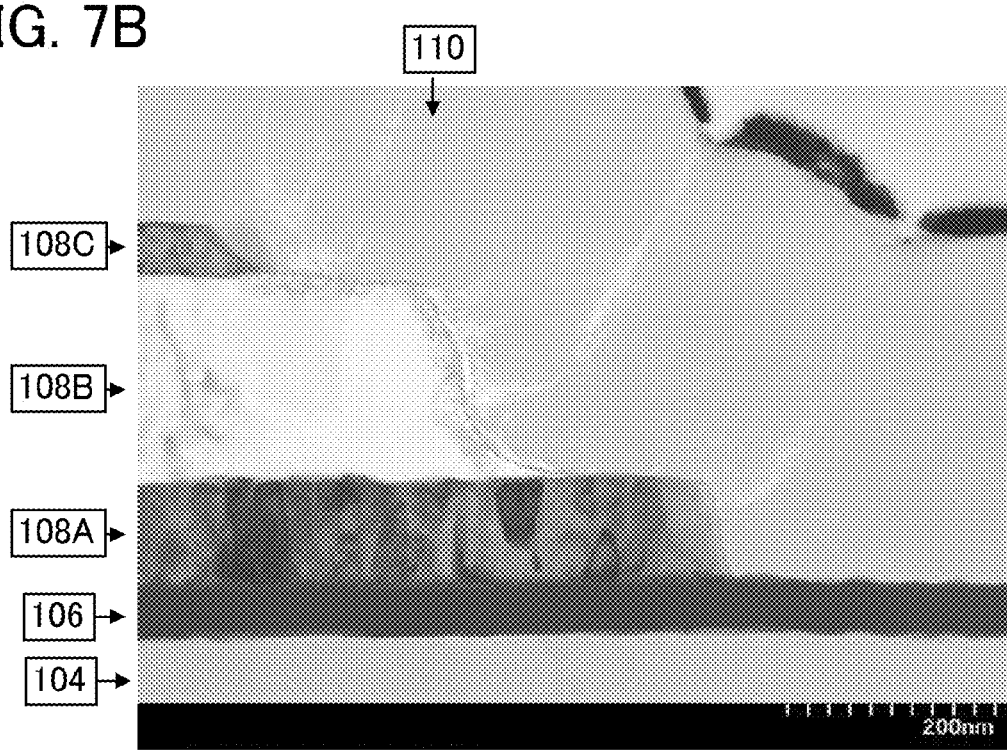

In this example, the transistor of Embodiment 1, that is, the transistor shown in FIG. 3A is actually fabricated, and STEM images of a cross section of the transistor are illustrated in FIGS. 7A and 7B.

A glass substrate was used as the substrate 100. Note that, a base insulating layer was formed using silicon oxynitride between the substrate 100 and the first wiring layer 102.

The first wiring layer 102 was formed of tungsten and had a thickness of 150 nm.

The first insulating layer 104 was formed of a silicon oxynitride and had a thickness of 100 nm.

The semiconductor layer 106 was formed of an In—Ga—Zn—O-based oxide semiconductor and had a thickness of 50 nm.

The first layer 108A of the second wiring layer was formed of Ti and had a thickness of 100 nm. The second layer 108B of the second wiring layer was formed of Al and had a thickness of 200 nm. The third layer 108C of the second wiring layer was formed of Ti and had a thickness of 50 nm.

The second insulating layer 110 was formed of a silicon oxide and had a thickness of 300 nm.

Here, two kinds of samples were prepared for comparison.

As for a first sample, etching for processing the multilayer conductive film 107 to form the second wiring layers 108 is performed using only a mixture gas of a $BCl_3$ gas and a $Cl_2$ gas.

As for a second sample, two-step etching for processing the multilayer conductive film 107 to form the second wiring layer 108 was performed. The first etching process was performed using a mixture gas of a $BCl_3$ gas and a $Cl_2$ gas, and the second etching process was performed using only a $SF_6$ gas.

FIG. 7A is a cross-sectional STEM image of the side surface of the second wiring layer 108 in the first sample. FIG. 7B is a cross-sectional STEM image of the side surface of the second wiring layer 108 in the second sample.

As seen from FIGS. 7A and 7B, the semiconductor layer 106 of the first sample is etched; however, the semiconductor layer 106 of the second sample is hardly etched. In other words, by the two-step etching that is one embodiment of the present invention, the layer provided below and in contact with the film to be etched was able to prevent from being etched while being etched deeply in a conventional method.

This application is based on Japanese Patent Application serial no. 2010-161374 filed with Japan Patent Office on Jul. 16, 2010, the entire contents of which are hereby incorporated by reference.

What is claimed is:

1. A method for manufacturing a semiconductor device, comprising the steps of:
    forming an oxide semiconductor layer;
    forming a stack of conductive films on the oxide semiconductor layer, wherein the stack comprises a first conductive film on the oxide semiconductor layer, a second conductive film on the first conductive film, and a third conductive film on the second conductive film;
    selectively etching the stack until the first conductive film is exposed, and
    selectively etching the first conductive film until the oxide semiconductor layer is exposed,
    wherein the oxide semiconductor layer is not overlapped with a first end portion of the first conductive film, a first end portion of the second conductive film, and a first end portion of the third conductive film, and
    wherein the first end portions of the first conductive film, the second conductive film, and the third conductive film are not aligned with each other.

2. The method according to claim 1, wherein in the step of selectively etching the first conductive film, an etching rate for the first conductive film is higher than that in the step of selectively etching the stack, and an etching rate for the oxide semiconductor layer is lower than that in the step of selectively etching the stack.

3. The method according to claim 1,
wherein the second conductive film has higher conductivity than each of the first conductive film and the third conductive film, and
wherein the second conductive film is thicker than each of the first conductive film and the third conductive film.

4. The method according to claim 1,
wherein each of the first conductive film and the third conductive film comprises titanium, and
wherein the second conductive film comprises aluminum.

5. The method according to claim 1,
wherein the first end portion of the third conductive film is provided on an upper surface of the second conductive film, and
wherein the first end portion of the second conductive film is provided on an upper surface of the first conductive film.

6. The method according to claim 1, further comprising steps of:
forming a resist mask on the stack before the step of selectively etching the stack; and
removing the resist mask after the step of selectively etching the first conductive film.

7. The method according to claim 1, further comprising steps of:
forming an insulating layer covering the oxide semiconductor layer and the stack after the step of selectively etching the first conductive film; and
forming an electrode over the insulating layer to overlap with the oxide semiconductor layer.

8. A method for manufacturing a semiconductor device, comprising the steps of:
forming an oxide semiconductor layer;
forming a stack of conductive films over the oxide semiconductor layer, the stack comprises a first conductive film on the oxide semiconductor layer, a second conductive film on the first conductive film, and a third conductive film on the second conductive film;
selectively etching the stack until the first conductive film is exposed, and
selectively etching the first conductive film until the oxide semiconductor layer is exposed,
wherein the oxide semiconductor layer is not overlapped with a first end portion of the first conductive film, a first end portion of the second conductive film, and a first end portion of the third conductive film and is overlapped with a second end portion of the first conductive film, a second end portion of the second conductive film, and a second end portion of the third conductive film,
wherein the first end portions of the first conductive film, the second conductive film, and the third conductive film are not aligned with each other, and
wherein the second end portions of the first conductive film, the second conductive film, and the third conductive film are not aligned with each other.

9. The method according to claim 8, wherein in the step of selectively etching the first conductive film, an etching rate for the first conductive film is higher than that in the step of selectively etching the stack, and an etching rate for the oxide semiconductor layer is lower than that in the step of selectively etching the stack.

10. The method according to claim 8,
wherein the second conductive film has higher conductivity than each of the first conductive film and the third conductive film, and
wherein the second conductive film is thicker than each of the first conductive film and the third conductive film.

11. The method according to claim 8, wherein the first conductive film is thicker than the third conductive film.

12. The method according to claim 8,
wherein each of the first conductive film and the third conductive film comprises titanium, and
wherein the second conductive film comprises aluminum.

13. The method according to claim 8,
wherein the second end portion of the third conductive film is provided on an upper surface of the second conductive film,
wherein the second end portion of the second conductive film is provided on an upper surface of the first conductive film, and
wherein the second end portion of the first conductive film is provided on an upper surface of the oxide semiconductor layer.

14. The method according to claim 8, further comprising steps of:
forming a resist mask on the stack before the step of selectively etching the stack; and
removing the resist mask after the step of selectively etching the first conductive film.

15. The method according to claim 8, further comprising steps of:
forming an insulating layer covering the oxide semiconductor layer and the stack after the step of selectively etching the first conductive film; and
forming an electrode over the insulating layer to overlap with the oxide semiconductor layer.

* * * * *